United States Patent [19]

Carbou et al.

[11] Patent Number: 5,610,546
[45] Date of Patent: Mar. 11, 1997

[54] CONTROLLED DELAY CIRCUIT

[75] Inventors: Pierre Carbou, Vence; Pascal Guignon, Callian Fayence; Philippe Perney, Nice, all of France

[73] Assignee: Texas Instruments Incorporated, Dallas, Tex.

[21] Appl. No.: 164,606

[22] Filed: Dec. 9, 1993

[30] Foreign Application Priority Data

Dec. 9, 1992 [FR] France ................................. 92 14861

[51] Int. Cl.$^6$ .................................................. H03H 11/26
[52] U.S. Cl. ........................ 327/261; 327/263; 327/264; 327/266
[58] Field of Search ................................. 307/602, 603, 307/605, 594, 595, 597, 451, 585, 269; 328/55, 66, 63, 72; 327/108, 111, 210, 215, 219, 263, 264, 266, 391, 393, 394, 530, 535, 538, 541, 261

[56] References Cited

U.S. PATENT DOCUMENTS

| | | | |
|---|---|---|---|
| 4,617,477 | 10/1986 | DePaolis, Jr. | 307/605 |
| 4,704,547 | 11/1987 | Kirsch | 307/443 |
| 4,800,304 | 1/1989 | Takeuchi | 307/602 |
| 4,967,110 | 10/1990 | Matsuura | 307/602 |
| 5,066,868 | 11/1991 | Doty, II et al. | 307/605 |
| 5,068,553 | 11/1991 | Love | 307/605 |
| 5,117,130 | 5/1992 | Shoji | 307/443 |
| 5,180,938 | 1/1993 | Sin | 307/605 |
| 5,214,320 | 5/1993 | Truong | 327/541 |

*Primary Examiner*—David C. Nelms
*Assistant Examiner*—Trong Phan
*Attorney, Agent, or Firm*—William E. Hiller; Richard L. Donaldson

[57] ABSTRACT

Delay circuit comprising a delay cell formed by a current source (I) connected between drain and source of two field-effect transistors (PO, NO) whose gates are connected to each other in order to constitute the input of the cell, and an inverter (INV) linked to one or other of the terminals of the current source (I) according to whether the delay is to affect the leading edge or the trailing edge of the signal to be delayed, a capacitor (C) for defining a delay time (Te) proportional to the power supply voltage and inversely proportional to the current (I) delivered by the current source, being connected between the input of the inverter (INV) and earth, characterized in that it furthermore comprises a circuit (Ci, Cu, S1, S3, AMPLO, P1) for regulating the current delivered by the current source in order to make it proportional to the power supply voltage of the circuit.

8 Claims, 3 Drawing Sheets

CONTROLLED DELAY CIRCUIT

FIELD OF THE INVENTION

The present invention relates to delay circuits and applies more particularly to a controlled delay circuit.

BACKGROUND OF THE INVENTION

The development of portable equipment, in particular in the field of telecommunications, is leading to the necessity for integrated circuits to be available operating within a wider range of power supply voltages (2.7 volts to 5.5 volts) than for conventional devices (5 volts +/−10%).

The construction of digital CMOS circuits rests on a clock with two anti-overlap systems, such that the variations in the non-overlap values have an influence on the performance of such circuits.

SUMMARY OF THE INVENTION

The object of the present invention is to create a delay device which is independent of the value of the power supply voltage, in order to reduce the variations in the anti-overlap value to a minimum, and to ensure good performance by the circuit despite significant variations in the power supply voltage.

Thus its object is a delay circuit comprising a least one delay cell formed by a current source connected between the drains of two field-effect transistors whose gates are connected to each other in order to constitute the input of the cell, and an inverter linked to one or other of the terminals of the current source according to whether the delay is to affect the leading edge or the trailing edge of the signal to be delayed, a capacitor for defining a delay time proportional to the power supply voltage and inversely proportional to the current delivered by the current source, being connected between the input of the inverter and earth, characterized in that it furthermore comprises a circuit for regulating the current delivered by the current source in order to make it proportional to the power supply voltage of the circuit.

As it will be shown in the description which will follow, this delay device depends only on the capacitance and on the ratio of the current mirror, which are kept well controlled in CMOS technology.

BRIEF DESCRIPTION OF THE DRAWINGS

The invention will be better understood on reading the description which will follow, written with reference to the attached drawings which are given only by way of example and in which.

DETAILED DESCRIPTION OF THE PREFERRED EMBODIMENTS

FIG. 1 represents a means for generating a delay with the aid of a CMOS circuit. It takes the form of a circuit comprising a P-channel transistor PO, the gate of which is connected to the input of the circuit and the drain of which is linked to a current source I which is connected moreover to the drain of a N-channel transistor NO, the gate of which is connected to the input of the circuit and the source of which is connected to earth.

The drain of the transistor PO is furthermore connected to an inverter INV, the output of which forms the output of the circuit and the input of which is connected to a capacitor C linked to earth.

The signal IN is applied to the input of the CMOS inverter produced by means of the transistor PO, of the transistor NO, of the current source I connected between the drain of the transistor PO and the drain of the transistor NO, of the capacitor C connected between the drain of the transistor PO and earth, and of the inverter INV proper, the input Vc of which is connected to the drain of the transistor PO.

Figure 1A:
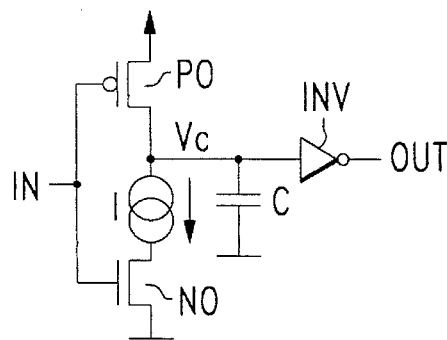
FIGS. 1A, 1B are electrical diagrams representing a known means for generating a delay with a CMOS circuit.
Figure 1C:
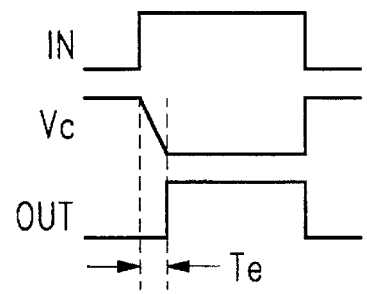
FIGS. 1C, 1D are signal diagrams at particular points of the circuits of FIG. 1A, 1B respectively.

As represented in FIG. 1C, the abovementioned configuration makes it possible to delay the rising edge of the signal IN. In fact, the rising edge of the signal OUT of the inverter INV is delayed by a time Te with respect to the rising edge of the input signal IN by reason of the charge time of the capacitor C.

Figure 1B:
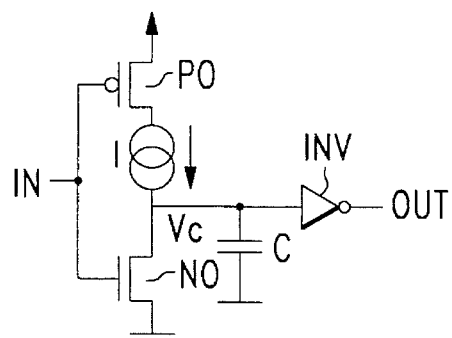
Figure 1D:
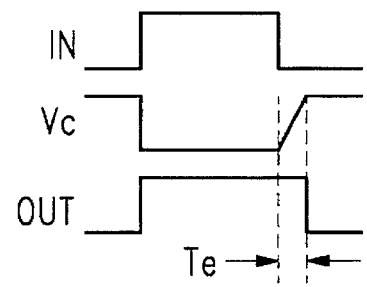

By connecting the capacitor C and the input of the inverter INV to the drain of the transistor NO as represented in FIG. 1B, the circuit otherwise being identical to that of FIG. 1A, it is the falling edge of the signal IN which is delayed. The signals of the circuit of FIG. 1D are represented in FIG. 1D.

In both cases, an edge of the signal at the output OUT of the inverter INV is delayed by a value Te:

$$Te = \frac{C\, k\, Vdd}{I} \quad (1)$$

where I is the current from the current source, k Vdd is the threshold voltage of the inverter and C is the value of the capacitance of the capacitor.

The value of k depends mainly on the size ratio of the two transistors of the inverter.

One drawback of this solution resides in the fact that the delay generated varies proportionally to the power supply voltage and to the capacitance C.

The proposed solution allows the current I to be made proportional to the power supply voltage Vdd and to the capacitance C.

Figure 2:
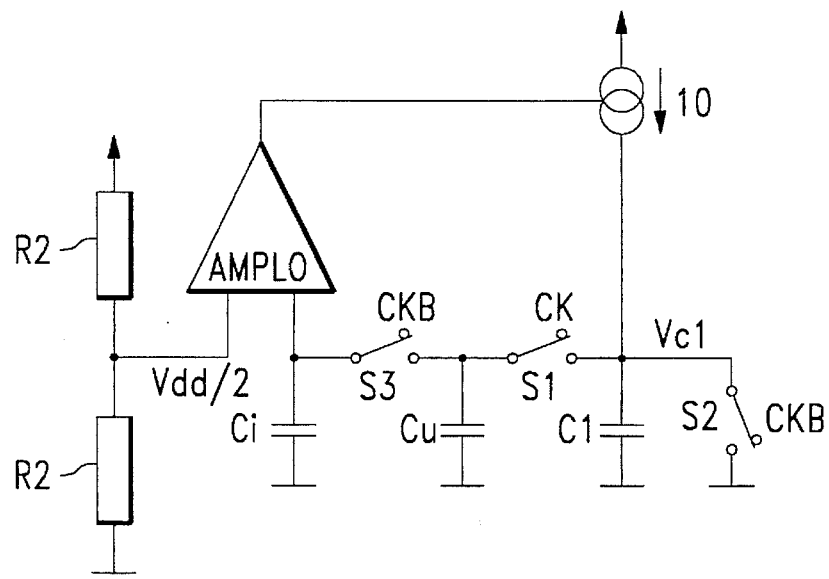
FIG. 2 is an electrical diagram of a device according to the invention for generating a current proportional to the power supply voltage.

The diagram represented in FIG. 2 represents the means used to make the delay independent of the power supply voltage. It comprises mainly a differential amplifier AMPLO, one input of which is connected between two resistors R1, R1 of a voltage divider wired between the power supply voltage Vdd and earth,.

The other input of the differential amplifier AMPLO is connected to earth via three capacitors Cl, Cu, Ci in parallel, a switch S1 being interposed between the capacitors C1 and Cu, a switch S2 being interposed between one terminal of the capacitor C1 and earth and a switch S3 being interposed between the capacitors Cu and Ci.

The capacitor C1 has a capacitance which is markedly greater than that of the capacitor Cu, the ratio between these two capacitances being of the order of 10. The capacitor Ci also has a capacitance greater than that of the capacitor Cu.

The switch S1 is controlled by the clock signal CK, while the switches S2 and S3 are both controlled by the signal CKB, which is the complement of the clock signal.

The output of the amplifier AMPLO is connected to a current source IO wired between the power supply voltage Vdd and the terminal of the capacitor C1 linked to the switches S1 and S2.

The principle consists in generating a current IO which is proportional to the power supply voltage Vdd and to the capacitance C. During the clock signal CK, the capacitors C1 and Cu are put in parallel and connected to the current source IO. The capacitor C1 fixes the current delivered by the current source. The capacitor Cu establishes the voltage to be regulated. At the end of the clock signal CK, the value of the voltage at the terminals of the abovementioned capacitors is:

$$Vc1 = \frac{IO\, T/2}{C1 + Cu}$$

where T is the period of the clock signal CK. During the clock signal CKB, the capacitor C1 is short-circuited and the capacitor Cu is connected in parallel to the capacitor Ci. The resultant voltage at the terminals of the capacitors Ci and Cu is compared with the value Vdd/2 or with any other appropriate fraction of Vdd, generated by means of the voltage divider with resistors R1, R2, by the differential amplifier AMPLO which generates an error voltage.

This error voltage controls the value of IO which grows if the voltage at the terminals of the capacitor Ci is too small and increases if the voltage at the terminals Ci is too high. At equilibrium, the voltage at the terminals of the capacitor Ci is stabilized at Vdd/2, which means that there is no more charge redistribution between the capacitors Ci and Cu.

To this end, the capacitor Cu has to be charged to the voltage Vdd/2 at the end of the clock signal CK. As explained above, at the end of the clock signal CK, the charge at the terminals of the capacitor Cu is:

$$Vc = \frac{IO\, T/2}{C1 + Cu}$$

when $$Vc = \frac{Vdd}{2}$$

this gives:

$$\frac{Vdd}{2} = \frac{IO\, T/2}{C1 + Cu}$$

$$IO = \frac{Vdd(C1 + Cu)}{T}$$

The use of a copy of this current IO in the circuit generating a delayed signal gives:

$$Te = \frac{C\, k\, Vdd}{Vdd(C1 + Cu)}\, T$$

$$Te = T \frac{C}{(C1 + Cu)}\, k$$

The above relationship shows that the delay generated is now independent of the power supply voltage and depends only on the period of the clock, which is precise, on the capacitance ratio C/(C1+Cu), the precision of which depends essentially on the care in production, and on the ratio k of the devices N and P forming the inverter.

Figure 3:
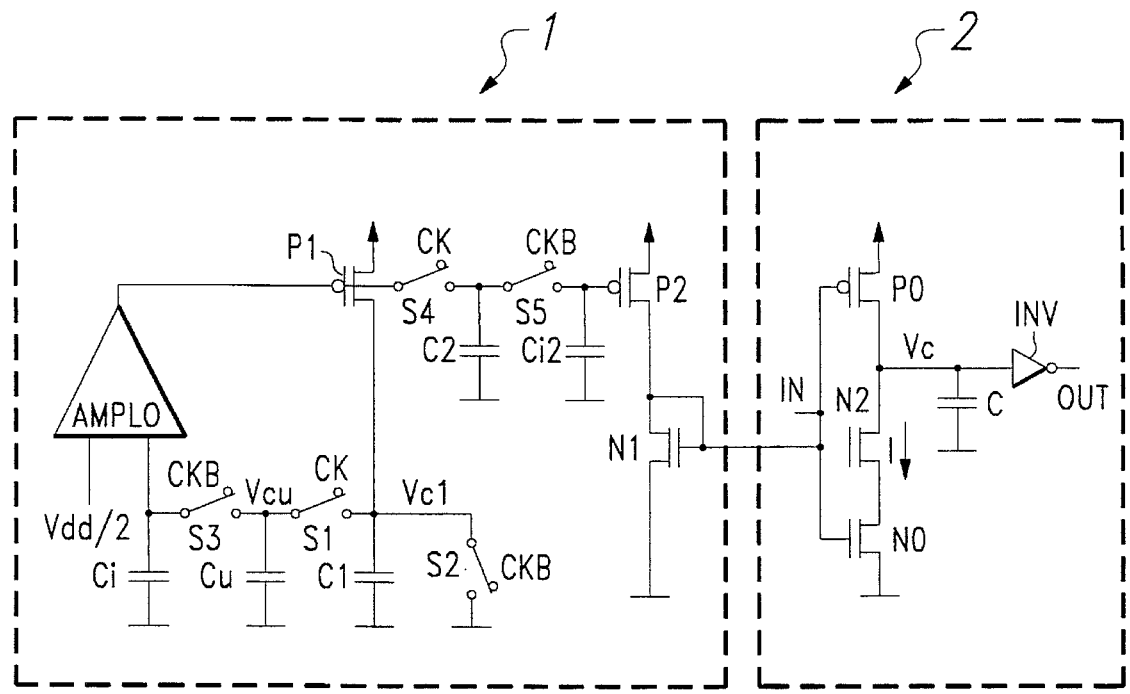
FIG. 3 is a more detailed electrical diagram of an embodiment of the delay device according to the invention.

FIG. 3 represents an embodiment of the present invention for generating a signal, the positive edge of which is delayed with respect to the input signal. The circuit includes a circuit 1 produced from capacitors C1, Cu, Ci, from switches S1, S2, S3, from an amplifier AMPLO and from a transistor P1, which ensures production of a current proportional to the power supply voltage. This circuit is surrounded by the rectangle in long and short dashes 1 in FIG. 3.

Switches S4 and S5 associated with capacitors C2 and Ci2 make it possible to keep, on the capacitor Ci2, the voltage present on the gate of the transistor P1 during the charging of the capacitors Cu+C1, and to generate, through a transistor P2, a precise copy of the current IO during the discharging of the capacitors Cu+C1. The circuit further includes a delay-cell forming circuit 2, represented by the rectangle in long and short dashes 2 in FIG. 3. Transistors N1 and N2 form a current mirror, N2 acting as current source in the delay cell 2. The rest of the circuit corresponds to the circuit of FIG. 1A.

Figure 4:
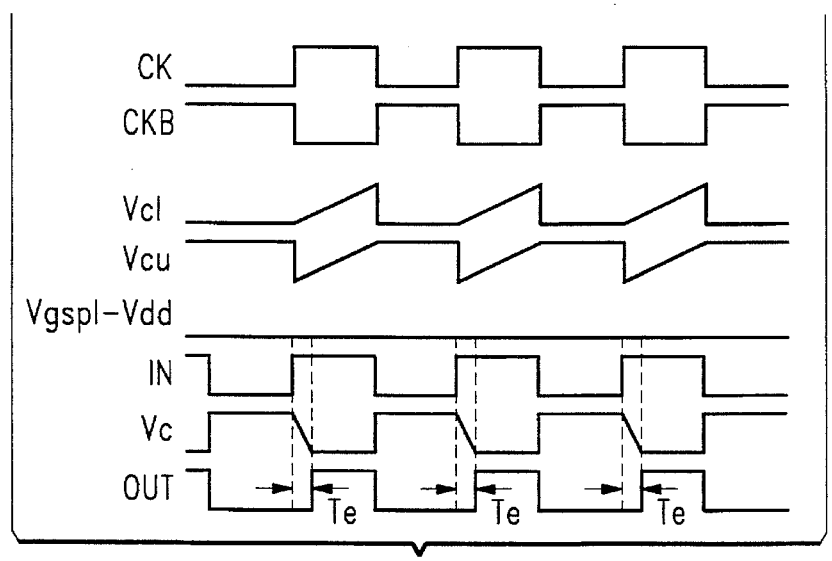
FIG. 4 is a diagram showing the signal wave-forms at various points of the circuit of FIG. 3.

FIG. 4 represents a diagram of the waveforms of the signals at various points of the circuit of FIG. 3.

In this figure can be seen:

the clock signal CK, the complement CKB of the clock signal, the voltage Vc1 on the capacitor C1, the voltage Vcu on the capacitor Cu, the voltage Vgsp1-Vdd applied to the pair of transistors N1, N2, the input signal IN, the voltage Vc at the terminals of the capacitor C of the delay circuit, the voltage OUT at the output of the delay circuit.

Figure 5:
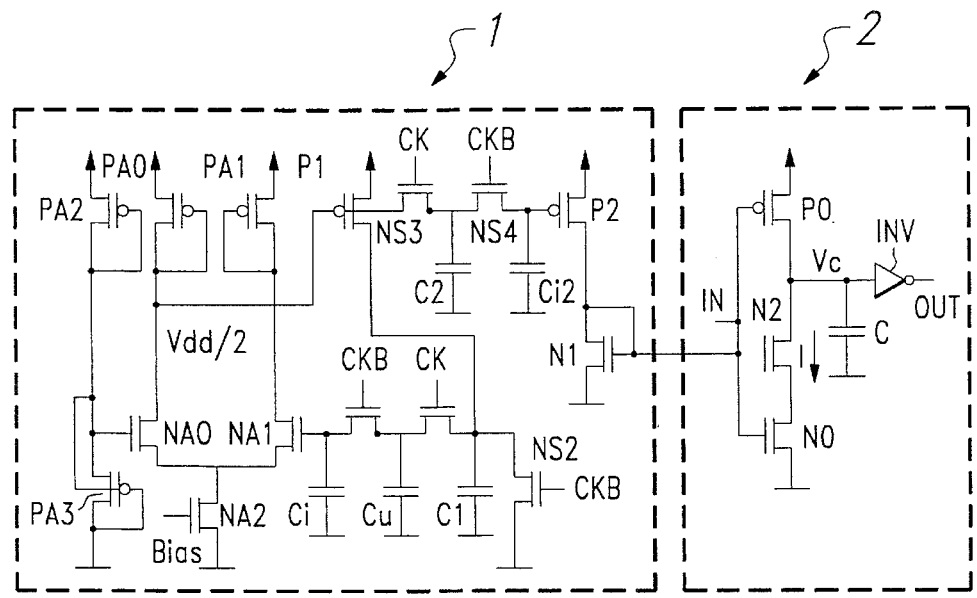
FIG. 5 is an electrical diagram for implementing the circuit of FIG. 3 with the aid of CMOS devices.

FIG. 5 represents a first possible implementation of the device according to the invention with CMOS circuits, the construction of which is described by reference to FIG. 3.

In this figure, the circuit 1 for generating a current proportional to the power supply voltage includes the three capacitors C1, Ci and Cu of the circuit of FIG. 3. In contrast, the three switches S1, S2 and S3 are physically represented respectively by MOS FET transistors NS1, NS2 and NS0, the source and the drain of which correspond to the fixed contacts and the gate corresponds to the movable contact.

The gate of the transistor NS1 is connected to the clock signal CK, while the gates of the transistors NS2 and NS0 are connected to the signal CKB which is the complement of the clock signal CK.

The differential amplifier AMPLO is physically represented by the transistors NA0, NA1, NA2 and PA0, PA1.

The gate of the transistor NA1 is connected to the capacitor Ci. The drain of this transistor is linked to the source-drain path of the transistor PA1 connected to the power supply voltage Vdd and the gate of which is connected to the drain.

The source of the transistor NA1 is connected to the source of the transistor NA0, the gate of which is connected to the output of a voltage divider delivering a voltage.

$$\frac{Vdd}{2}.$$

The point common to the source of the transistors NA0, NA1 is connected to the source-drain path of the transistor NA2 which receives a bias voltage Bias on its gate.

The drain of the transistor NA0 is connected to the source-drain path of a transistor PA0, the source of which is connected to the voltage Vdd and the gate of which is connected to the drain of the transistor PA0.

The voltage divider delivering the voltage $$\frac{Vdd}{2}$$

consists of two MOS FET transistors PA2, PA3 the source-drain paths of which are connected in series between the power supply voltage Vdd and earth and the gates of which are short-circuited with the drains.

The output of the differential amplifier AMPLO is connected to the gate of the MOS FET transistor P1, the source-drain path of which is connected between the voltage Vdd and the capacitor C1. Furthermore, the gate of the transistor PA3 is connected to the gate of the transistor NA0.

The gate of the transistor P1 is furthermore connected, via the source-drain path of a transistor NS3 physically representing the switch S4 of the circuit of FIG. 3, to one terminal of a capacitor C2, the other terminal of which is connected to earth.

The gate of the transistor NS3 is connected to the clock signal CK.

The capacitor C2 is connected to one terminal of a capacitor Ci2 via a transistor NS4 physically representing the switch S5 and the gate of which is controlled by the signal CKB.

The capacitor Ci2, the other terminal of which is connected to earth, is moreover linked to the gate of a P-channel transistor P2, the source-drain path of which is connected between the power supply voltage Vdd and the source-drain path of a N-channel transistor N1, the source of which is connected to earth and the gate of which is short-circuited with the drain.

The gate of the transistor N1 is, in its turn, linked to the gate of a transistor N2, the source-drain path of which is connected between the transistors P0 and N0 of the delay cell 2, those being connected in series between the power supply voltage Vdd and earth.

The gates of the transistors P0 and N0 are connected together to receive the input signal IN to be delayed.

Finally, as already described by reference to FIGS. 1A and 3, the inverter INV and its associated capacitor C are connected to the source of the transistor N2 in order, in this case, to obtain a delay on the rising edge of the input signal IN.

Figure 6:
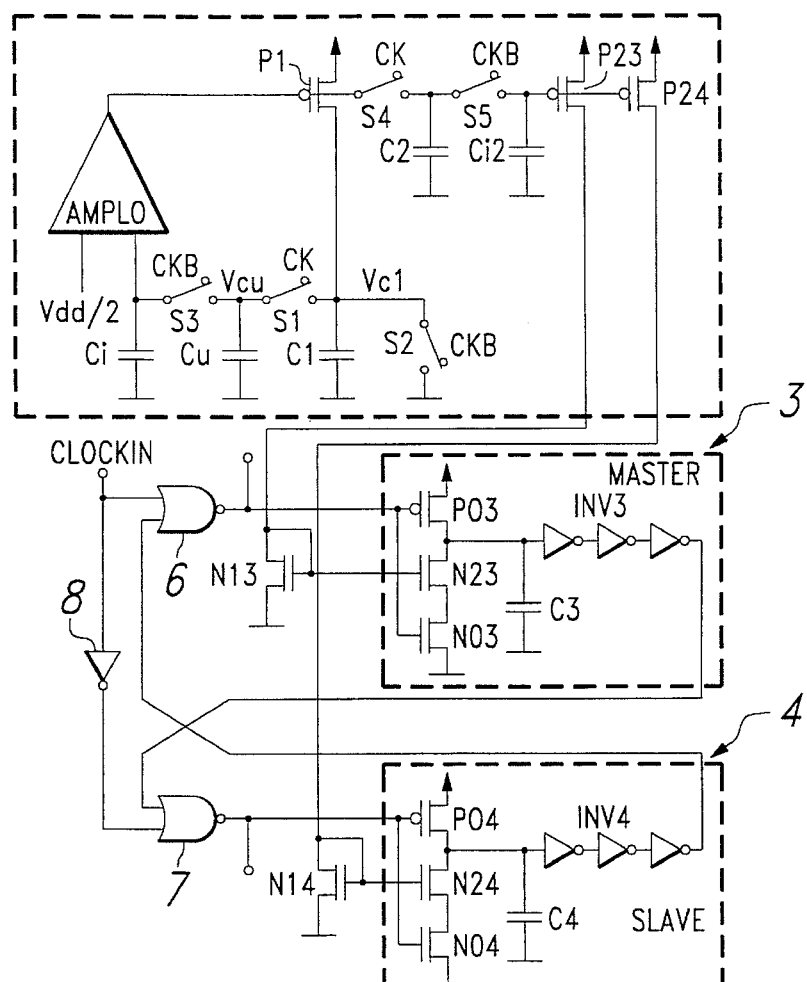
FIG. 6 represents the physical embodiment used to control the anti-overlap duration of a dual-phase clock system used in a CMOS digital circuit.

FIG. 6 represents a physical embodiment used to control the anti-overlap duration of a two-phase clock system used in a CMOS digital circuit.

This circuit includes two delay cells 3, 4 the structure of which is analogous to that of the delay cell 2 of the circuit of FIG. 5 and the components of which are assigned the same references with the corresponding index 3 and 4.

The circuit furthermore includes a circuit 5 for generating a current I proportional to the power supply voltage Vdd common to the two delay cells 3 and 4.

The circuit 5 is identical at all points to the circuit 1 of FIG. 3, with the exception of the fact that it includes two transistors P23 and P24 associated respectively with transistors N13 and N14 of the corresponding current mirrors.

Hence the circuit 5 applies the same current, proportional to the power supply voltage, to the two delay cells 3 and 4.

The cell 3 is considered to be the "master" cell, while the cell 4 is the "slave" cell.

The inputs of the two delay cells 3 and 4 are connected to the outputs of two dual-input NOR gates 6 and 7.

The NOR gate 6 has one of its inputs connected to an input clock signal CLOCKIN while the NOR gate 7 receives the CLOCKIN signal, inverted by an inverter 8, on one of its inputs.

The other input of the NOR gate 6 is connected to the output of the inverter INV4 of the delay cell 4 while the other input of the NOR gate 7 is connected to the output of the inverter INV3 of the delay cell 3.

Having regard to that fact that the delay cells 3 and 4, in the present example, introduce a constant delay, independent of the variations in the power supply voltage of the circuit, outputs of the NOR gates 6 and 7 may be tapped off as respective clock signals generated by the circuit. These clock signals are obtained from input signals in phase opposition, and possess an anti-overlap duration which is constant in the presence of variations in the power supply voltage.

The proposed circuit has been developed to control an anti-overlap, two-phase CMOS clock generator, but it may have other applications, either in the field of digital circuitry, or in that of analog circuits requiring the generation of delayed signals which are insensitive to variations in the power supply voltage.

We claim:

1. A signal delay circuit comprising:

at least one delay cell, said at least one delay cell including first and second field-effect transistors, each of said first and second field-effect transistors having a source, a drain, a channel between the source and drain, and a control gate overlying the channel, the first and second field-effect transistors being of opposite channel conductivity types, the control gates of said first and second field-effect transistors being connected to each other, the drains of said first and second field-effect transistors being connected to each other, an input terminal connected to a node in the conncetion between the control gates of said first and second field-effect transistors, a current source having first and second terminals and being connected between the drains of said first and second terminals and field-effect transistors at said first and second terminals, an inverter having an input and an output, the input of said inverter being connected to one of said first and second terminals of said current source dependent upon whether the delay is to affect the leading edge or trailing edge of the signal to be delayed, and a capacitor connected between the input of said inverter and ground, said capacitor defining a delay time for the signal to be delayed proportional to the power supply voltage and inversely proportional to the current delivered by said current source; and a control circuit operably connected to said current source for regulating the current delivered by said current source so as to make the current proportional to the power supply voltage.

2. A signal delay circuit as set forth in claim 1, wherein said current source connected between the drains of said first and second field-effect transistors includes first and second field-effect transistors respectively having a source, a drain, a channel between the source and drain, and a control gate overlying the channel, the first and second field-effect transistors of said current source being arranged to define a current mirror in which the control gates of said first and second field-effect transistors included in said current source are connected together, and the source and drain of said first field-effect transistor included in said current source being connected between the drains of said first and second field-effect transistors of said at least one delay cell, and said control circuit having an output connected to said second field-effect transistor of said current source and providing a current proportional to the power supply voltage of the signal delay circuit to be copied by said current source.

3. A signal delay circuit comprising:

at least one delay cell, said at least one delay cell including first and second field-effect transistors, each of said first and second field-effect transistors having a source, a drain, a channel between the source and drain, and a control gate overlying the channel, the first and second field-effect transistors being of opposite channel conductivity types, the control gates of said first and second field-effect transistors being connected to each other, the drains of said first and second field-effect transistors being connected to each other, an input terminal connected to a node in the connection between the control gates of said first and second field-effect transistors, a current source having first and second terminals and being connected between the drains of said first and second field-effect transistors at said first and second terminals, an inverter having an input and an output, the input of said inverter being connected to one of said first and second terminals of said current source dependent upon whether the delay is to affect the leading edge or trailing edge of the signal to be delayed, and a capacitor connected between the input of said inverter and ground, said capacitor defining a delay time for the signal to be delayed proportional to the power supply voltage and inversely proportional to the current delivered by said current source, and a control circuit operably connected to said current source for regulating the current delivered by said current source so as to make the current proportional to the power supply voltage, said control circuit including voltage generating means for generating a voltage during a first clock signal having a predetermined relationship with the current delivered by said current source, and comparison means for comparing the voltage linked to the current as delivered by said current source with a selected fraction of the power supply voltage during a second clock signal complementary to the first clock signal, said comparison means producing an error signal as an output for regulating said current source such that the voltage linked to the current delivered by said current source and the said fraction of the power supply voltage are substantially equal.

4. A signal delay circuit as set forth in claim 3, wherein said voltage generating means comprises first and second capacitors connected in parallel to said current source, a clock-controlled switch interposed in the connection between said first and second capacitors and said current source and being responsive to the first clock signal, and said first capacitor of said voltage generating means fixing the current as delivered by said current source, said second capacitor of said voltage generating means being of smaller capacitance than said first capacitor and establishing the voltage to be compared with said fraction of the power supply voltage.

5. A signal delay circuit as set forth in claim 4, wherein said comparison means for comparing the voltage linked to the current as delivered by said current source with said fraction of the power supply voltage comprises a third capacitor connected in parallel with said second capacitor, a second clock-controlled switch interposed in the connection between said second and third capacitors and being responsive to the second clock signal, a third clock-controlled switch connected between said first capacitor and ground and being responsive to the second clock signal for short-circuiting said first capacitor, and a differential amplifier having first and second inputs for comparing said fraction of the power supply voltage with a voltage resulting from a redistribution of charge between said second capacitor and said third capacitor during the second clock signal.

6. An anti-overlap two-phase clock generator comprising:

first and second delay cells, each of said delay cells including first and second field-effect transistors, each of said first and second field-effect transistors having a source, a drain, a channel between the source and drain, and a control gate overlying the channel, the first and second field-effect transistors being of opposite channel conductivity types, the control gates of said first and second field-effect transistors being connected to each other, the drains of said first and second field-effect transistors being connected to each other, an input terminal connected to a node in the connection between the control gates of said first and second field-effect transistors, a current source having first and second terminals and being connected between the drains of said first and second field-effect transistors at said first and second terminals, an inverter having an input and an output, the input of said inverter being connected to one of said first and second terminals of said current source dependent upon whether the delay is to affect the leading edge or trailing edge of the signal to be delayed, and a capacitor connected between the input of said inverter and ground, said capacitor defining a delay time for the signal to be delayed proportional to the power supply voltage and inversely proportional to the current delivered by said current source;

a control circuit common to said first and second delay cells and being respectively operably connected to the current source of each of said first and second delay cells for regulating the current delivered by the respective current source so as to make the current proportional to the power supply voltage;

first and second logic means having respective first and second inputs and an output, said first and second logic means respectively receiving a clock input signal and an inverted clock input signal at the first inputs thereof;

the outputs of said first and second logic means being respectively connected to corresponding input terminals of said first and second delay cells; and the output of said first delay cell being connected to the second input of said second logic means and the output of said second delay cell being connected to the second input of said first logic means.

7. An anti-overlap two-phase clock generator as set forth in claim 6, wherein said first and second logic means are NOR gates.

8. An anti-overlap two-phase clock generator as set forth in claim 7, wherein said control circuit common to said first and second delay cells includes voltage generating means for generating a voltage during a first clock signal having a predetermined relationship with the current delivered by said current source of each of said first and second delay cells, and comparison means for comparing the voltage linked to the current as delivered by said current source of each of said first and second delay cells with a selected fraction of the power supply voltage during a second clock signal complementary to the first clock signal, said comparison means producing an error signal as an output for regulating said current sources of each of said first and second delay cells such that the voltage linked to the current as delivered by said current sources of each of said first and second delay cells and the said fraction of the power supply voltage are substantially equal.

* * * * *